United States Patent
Xia et al.

(10) Patent No.: US 7,537,429 B2
(45) Date of Patent: May 26, 2009

(54) FAN FASTENER FOR FASTENING A FAN TO A HEAT SINK AND METHOD OF USING THE SAME

(75) Inventors: Wan-Lin Xia, Shenzhen (CN); Tao Li, Shenzhen (CN); Min-Qi Xiao, Shenzhen (CN); Jun Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 456 days.

(21) Appl. No.: 11/308,555

(22) Filed: Apr. 6, 2006

(65) Prior Publication Data

US 2007/0237602 A1   Oct. 11, 2007

(51) Int. Cl.
*F16B 37/12* (2006.01)
(52) U.S. Cl. ............... 415/119; 415/213.1; 415/214.1; 415/220
(58) Field of Classification Search ............... 415/119, 415/213.1, 214.1, 220
See application file for complete search history.

(56) References Cited

U.S. PATENT DOCUMENTS

| | | | | |
|---|---|---|---|---|
| 4,568,243 A | * | 2/1986 | Schubert et al. | 415/213.1 |
| 5,316,423 A | * | 5/1994 | Kin | 411/510 |
| 6,322,382 B1 | * | 11/2001 | Viallet | 439/248 |
| 6,324,731 B1 | * | 12/2001 | Pliml, Jr. | 24/453 |
| 6,459,584 B1 | * | 10/2002 | Kuo | 361/704 |
| 6,637,502 B1 | | 10/2003 | North et al. | |
| 6,654,246 B2 | | 11/2003 | Wu | |
| 6,894,897 B1 | * | 5/2005 | Nagurny et al. | 415/213.1 |
| 2005/0271506 A1 | * | 12/2005 | Pan | 415/176 |
| 2006/0045616 A1 | * | 3/2006 | Sura et al. | 403/408.1 |

* cited by examiner

*Primary Examiner*—Igor Kershteyn
(74) *Attorney, Agent, or Firm*—Frank R. Niranjan

(57) ABSTRACT

A fastener, for assembling a fan to a bracket, includes a shaft, and an expanding head extending from an end of the shaft. The shaft has a bulge formed at an opposite end thereof. A handle extends from the bulge of the shaft. The handle is used for facilitating an operator to manipulate the fastener to secure the fan and the bracket together. By pulling the handle of the fastener, the shaft of the fastener extends through the fan and the bracket to reach a position where the head and the bulge of the shaft of the fastener tightly sandwich the fan and the bracket therebetween.

13 Claims, 4 Drawing Sheets

FAN FASTENER FOR FASTENING A FAN TO A HEAT SINK AND METHOD OF USING THE SAME

FIELD OF THE INVENTION

The present invention relates generally to a fastener assembly for fastening two components together, and more particularly to a fan fastener fastening a fan to a fan holder of a heat sink for dissipating heat generated by an electronic device.

DESCRIPTION OF RELATED ART

It is well known that, during operation of a computer, electronic devices such as central processing units (CPUs) frequently generate large amounts of heat. The heat must be quickly removed from the electronic device to prevent it from becoming unstable or being damaged. Typically, a heat sink is attached to an outer surface of the electronic device to absorb heat from the electronic device. The heat absorbed by the heat sink is then dissipated to ambient air. Generally, in order to improve heat dissipation efficiency of the heat sink, a fan assembly is attached to the heat sink to provide forced airflow to the heat sink.

Conventionally, a fan is fastened to a fan holder such as a bracket of a heat sink directly via a plurality of screws. However, it is time-consuming and laborious to screw the screws to the fan holder through the fan in order to combine the fan to the fan holder together. Furthermore, a fixation by the screws cannot effectively absorb vibration made by the fan when it rotates, whereby a noise is generated by the fan in operation, which is required to be further reduced.

What is needed, therefore, is a fastener fastening a fan to a fan holder of a heat sink conveniently; furthermore, the fastener can absorb vibration of the fan in operation thereby to reduce noise level generated by the fan during operation thereof.

SUMMARY OF INVENTION

A fastener in accordance with an embodiment of the present invention, for assembling a fan to a bracket (fan holder) of a heat sink, comprises a shaft. The shaft has an expanding head formed at an end thereof and a bulge formed at an opposite end thereof. A handle extends from the bulge of the shaft for facilitating operation of an operator to combine the fan and bracket together.

A method in accordance with an embodiment of the present invention for fastening the fan to the bracket includes the steps of:

a) providing a plurality of fasteners, each of the fasteners comprising a shaft and a handle extending from a first end of the shaft;

b) inserting the fasteners into corresponding fixing holes of the fan and then the bracket until the handles of the fasteners project a distance beyond the fixing holes of the bracket;

c) pulling the handles of the fasteners to extend the first ends of the shafts of the fasteners to reach a position beyond the fixing holes of the bracket;

d) releasing the pulling force on the handles of the fasteners whereby the fan and bracket are tightly sandwiched between an expanding head and a bulge formed on each of the shafts of the fasteners, and then cutting the handles away from the fasteners.

Other advantages and novel features will become more apparent from the following detailed description of preferred embodiments when taken in conjunction with the accompanying drawings, in which:

DETAILED DESCRIPTION

Figure 1:
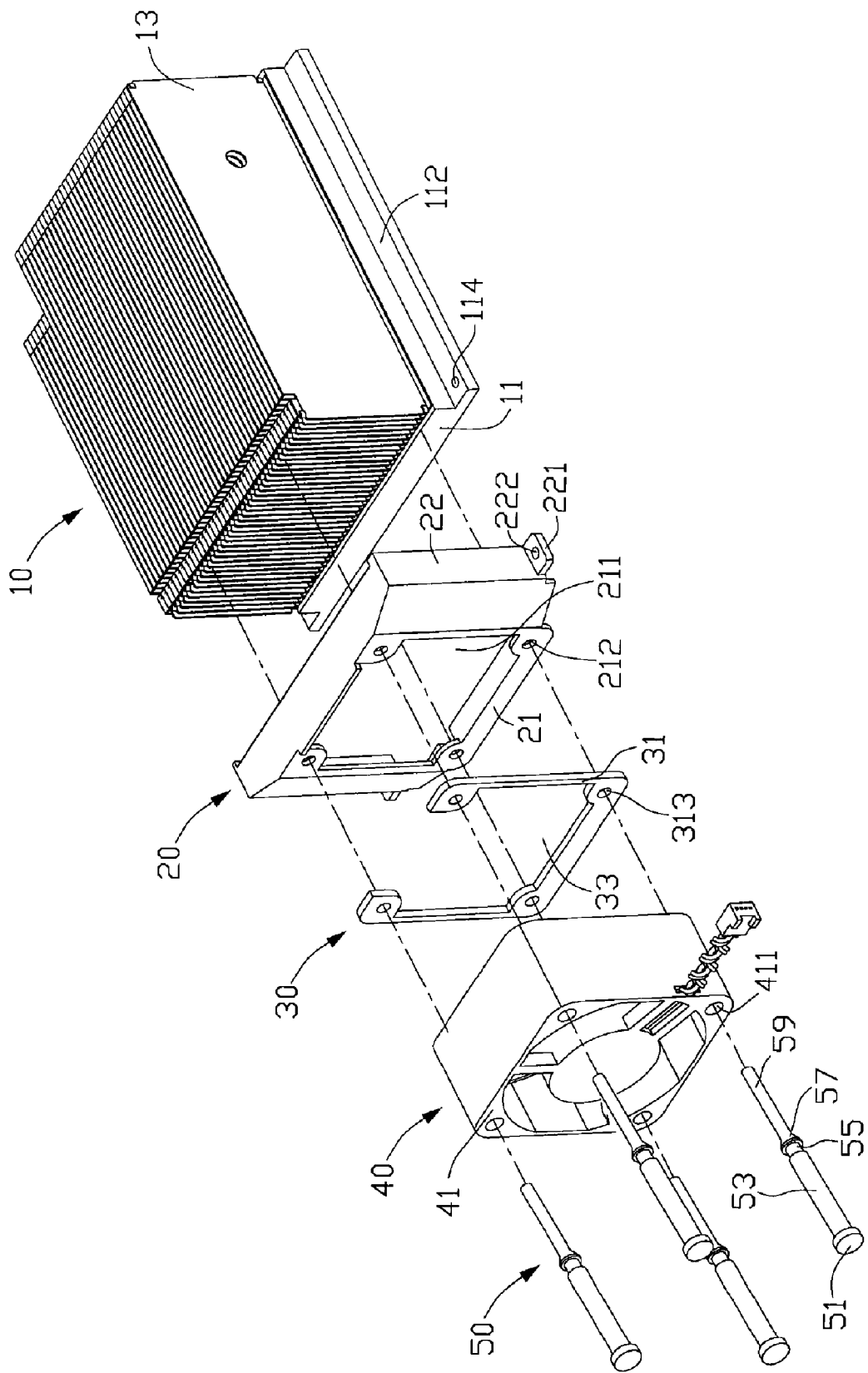
FIG. 1 is an exploded, isometric view of a fan assembly and a heat sink in accordance with a preferred embodiment of the present invention.

Referring to FIG. 1, a fan assembly and a heat sink 10 in accordance with a preferred embodiment of the present invention is shown. The fan assembly is attached to the heat sink 10 to provide forced airflow to the heat sink 10. The fan assembly comprises a fan 40, a bracket (fan holder) 20 for attached the fan 40 to the heat sink 10, a gasket 30 between the bracket 20 and the fan 40, a plurality of fasteners 50 fastening the fan 40 to the bracket 20.

The heat sink 10 comprises a base 11 and a plurality of fins 13 arranged on the base 11. The base 11 extends two thin steps 112 from two opposite lateral sides thereof, respectively. The two steps 112 define two fixing holes 114 at front ends thereof, respectively, for fixing the bracket 20 to the heat sink 10.

The bracket 20 comprises a substantially rectangular faceplate 21 and four sidewalls 22 extending from four sides of the faceplate 21. The faceplate 21 defines an opening 211 in a center thereof. Four fixing apertures 212 are defined in four corners of the faceplate 21, respectively. Two fastening ears 221 each having a fastening hole 222 defined therein oppositely extend from two lateral ones of the sidewalls 22, respectively, for fastening the bracket 20 to the heat sink 10. Two screws (not shown) are used to extend through the fastening holes 222 and screw into the fixing holes 114, thereby securing the bracket 20 to the heat sink 10, after the fan 40, the gasket 30 and the bracket 20 are assembled together.

The fan 40 is substantially rectangular, and comprises a frame 41 and a fan blade unit (not labeled) located in the frame 41. The fan blade unit is used to generate a forced airflow when it rotates. Four through holes 411 are defined in four corners of the frame 41, respectively, for accommodating the fasteners 50 therein.

The gasket 30 is substantially rectangular corresponding to the fan 40 and comprises three interconnecting beams 31 which define an opening 33 thereamong. Four through apertures 313 are defined in four corners of the gasket 30 corresponding to the through holes 411 of the frame 41 of the fan 40 and the fixing apertures 212 of the faceplate 21 of the bracket 20.

Figure 2:
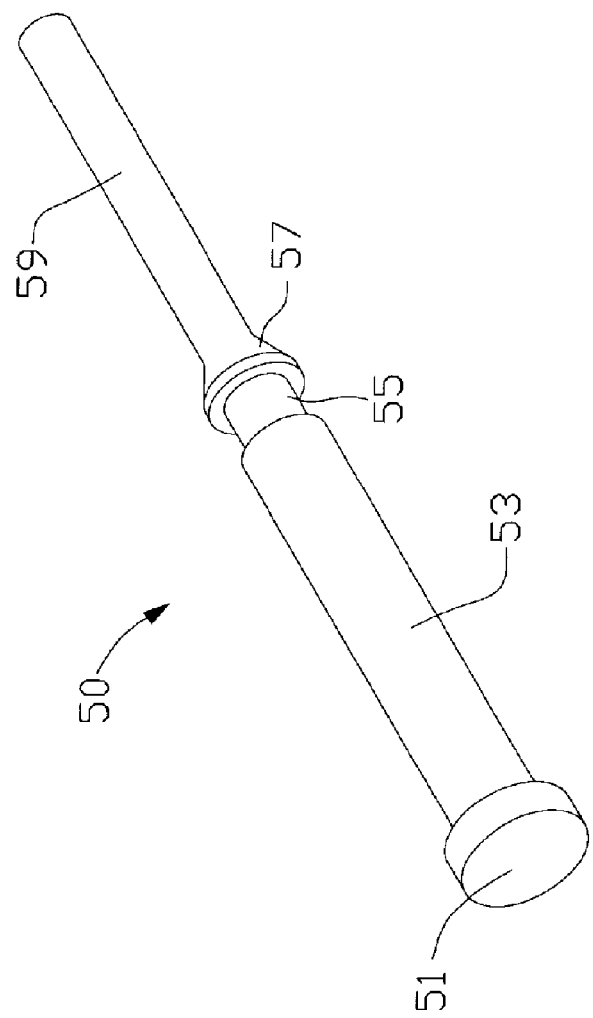
FIG. 2 shows a fastener of the fan assembly of FIG. 1.

Referring also to FIG. 2, each of the fan fasteners 50 has good elasticity and is integrally molded from elastomer such as plastics by for example plastics injection molding. Each fan fastener 50 has a pin-like shape, and comprises a shaft 53, an expanding head 51 extending from a front end of the shaft 53, and an elongate handle 59 extending from an opposite, rear end of the shaft 53. The shaft 53 has the opposite, rear end thereof tapered to form a bulge 57 thereat. The bulge 57 is formed around a circumference of the opposite, rear end of the shaft 53. A slot 55 is circumferentially defined in the shaft 53 just in front of the bulge 57 and between the bulge 57 and the expanding head 51. The head 51, the shaft 53 and the handle 59 are coaxial. A diameter of the head 51 is larger than that of the through hole 411 of the frame 41 of the fan 40. A diameter of the handle 59 is smaller than that of the through hole 411 and the fixing aperture 212 of the faceplate 21 of the bracket 20. A diameter of the bulge 57 is larger than that of the fixing aperture 212 of the faceplate 21. A length between the head 51 and the bulge 57 of the shaft 53 is slightly smaller than a total length of thicknesses of the fan 40, the gasket 30 and the faceplate 21 of the bracket 20.

Figure 3:
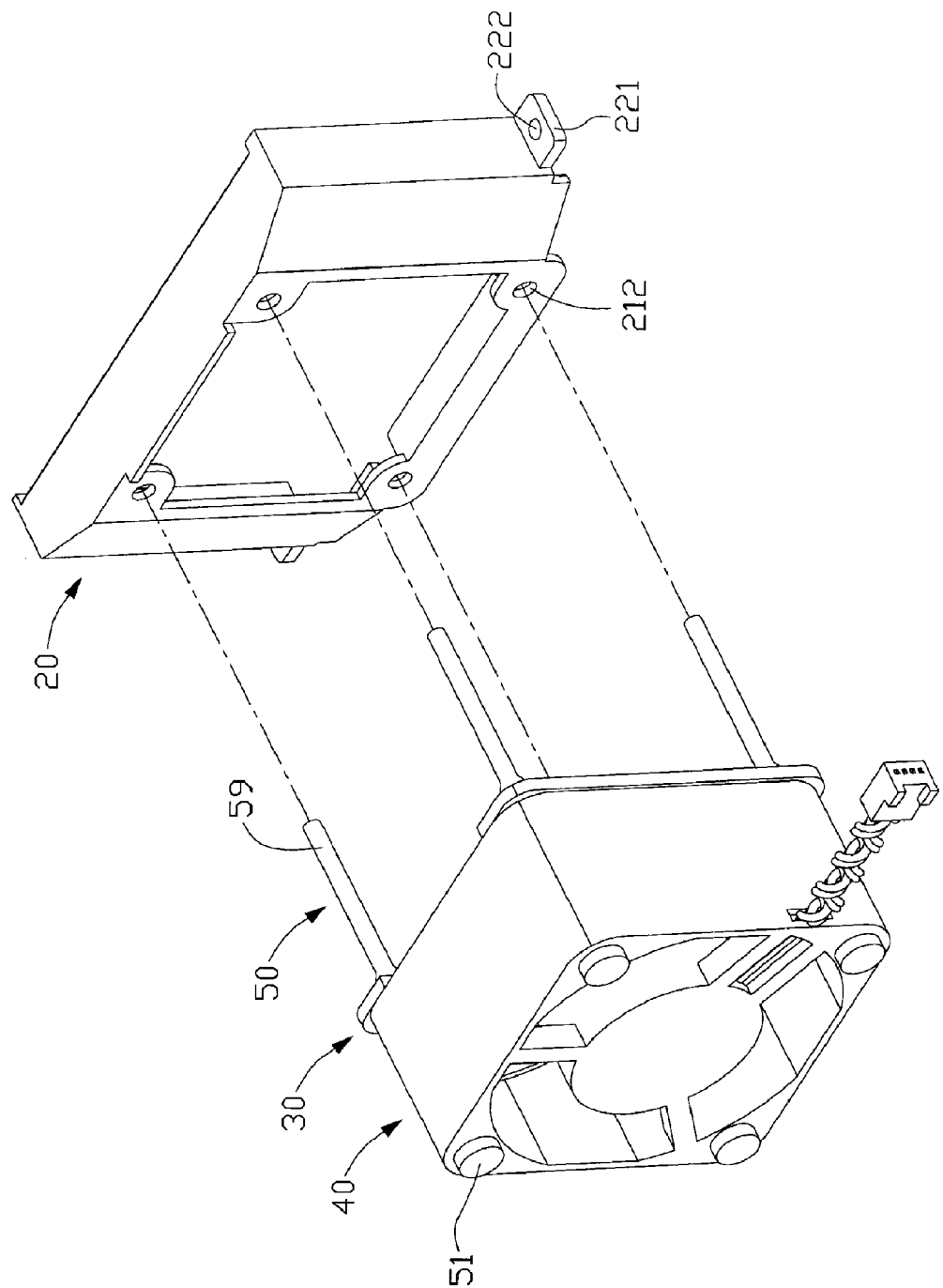
FIG. 3 is a partially assembled view of the fan assembly of FIG. 1.
Figure 4:
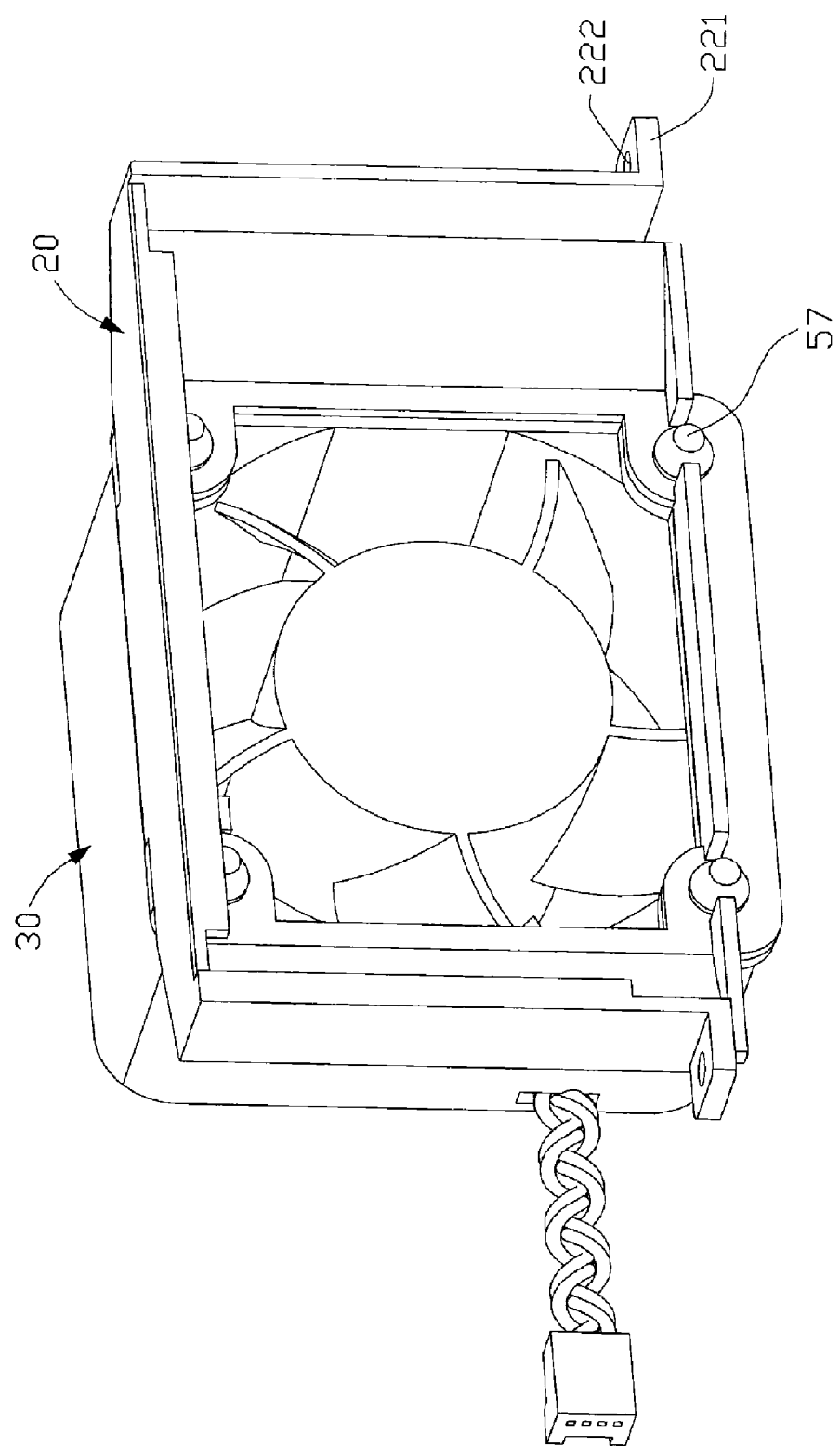
FIG. 4 is an assembled view of the fan assembly of FIG. 1 from a rear aspect, with a handle of the fan fastener being cut away.

Referring also to FIGS. 3 and 4, in assembly, the fasteners 50 are inserted into corresponding through holes 411 of the frame 41 of the fan 40 by extending the handles 59 through the through holes 411, then the through apertures 313 of the gasket 30 and the fixing apertures 212 until the handles 59 of the fan fasteners 50 project a distance rearwards beyond the fixing apertures 212 of the bracket 20. The handles 59 of the fan fasteners 50 are then pulled rearwards to reach a position wherein the slots 55 are located behind the through holes 411 of the fan 40 and the through apertures 313 of the gasket 30. The bracket 20 is pushed toward the fan 40 and the fan fasteners 50 are pulled to expand to thereby make the bulges 55 project beyond the fixing apertures 212 of the faceplate 21 of the bracket 20. Then, the pulling force on the handles 59 of the fan fasteners 50 is released, and the fan fasteners 50 shrink. Therefore, the bulges 55 tightly abut against a rear face of the faceplate 21 toward the fan 40, while the expanding heads 51 of the fan fasteners 50 securely abut against a front face of the frame 41 of the fan 40. The faceplate 21 of the bracket 20 defining the fixing apertures 212 is received in the slots 55 of the fasteners 50. Therefore, the fan 40, the gasket 30 and the bracket 20 are tightly sandwiched between the expanding heads 51 and the bulges 57 of the fasteners 50 and are intimately assembled together thereby. Thereafter, the handles 59 of the fan fasteners 50 are cut away. Finally, the bracket 20 with the fan 40 attached thereon is retained to a front side of the heat sink 10 via the screws (not shown) extended through the fastening holes 222 of the ears 221 of the bracket 20 and screwed in the fixing holes 114 of the base 11 of the heat sink 10. The handles 59 are formed for facilitating an operator to pull the fasteners 50 through the frame 41 of the fan 40, the gasket 30 and the bracket 20 to reach the position that the frame 41, the gasket 30 and the bracket 20 are securely combined together.

According to the embodiment of present invention, the fan 40, the gasket 30 and the bracket 20 are assembled only by first pushing and then pulling the fasteners 50 through the fan 40, the gasket 30 and the bracket 20; thus, the assembly thereof is quite easily and simple.

Additionally, the fasteners 50 have good flexibility, which provide elastic securing force to retain the fan 40 and the bracket 20 together. Furthermore, the elastic fasteners 50 buffer vibration of the fan 40 during operation thereof; thus, noises level generated by operation the fan 40 can be lowered. Additionally, the gasket 30 between the fan 40 and the bracket 20 is also made of elastic material, thereby further absorbing vibration of the fan 40 during operation thereof.

It is believed that the present embodiment and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for fastening a fan, an elastic gasket and a fan holder together, the fan holder being used for attaching the fan to a heat sink for dissipating heat from an electronic device, the elastic gasket being sandwiched between the fan and fan holder, the fan, elastic gasket and fan holder each defining a plurality of fixing holes therein, the method comprising the steps of:
 a) providing a plurality of fasteners, each of the fasteners comprising a shaft, a handle, a head and a bulge, the handle extending from a first end of the shaft and having a diameter smaller than that of the shaft, the head being located at a second end of the shaft opposite to the first end and having a diameter larger than that of the shaft, the bulge being formed on the shaft, tapered along a direction from the head to the handle and adjacent to the first end of the shaft, a slot being circumferentially defined in the shaft just in front of the bulge and between the bulge and the head;
 b) inserting the handles through the fixing holes of the fan, the fixing holes of the elastic gasket and then the fixing holes of the fan holder until the handles of the fasteners project a distance beyond the fixing holes of the fan holder;
 c) pulling the handles of the fasteners to extend the first ends of the shafts of the fasteners beyond the fixing holes of the fan holder; and
 d) releasing the pulling force on handles of the fasteners so that the fan, the elastic gasket and the fan holder are tightly sandwiched between the heads and the bulges of the shafts of the fasteners, and finally cutting away the handles from the fasteners.

2. The method as claimed in claim 1, wherein each of the fasteners is integrally made of plastics.

3. The method as claimed in claim 2, further comprising a step after step d): attaching the fan holder to the heat sink.

4. The method as claimed in claim 1, wherein at step b), the handles of the fasteners are also extended through a gasket between the fan and the fan holder.

5. A heat sink assembly comprising:
 a heat sink;
 a fan holder attached to a side of the heat sink, the fan holder defining a plurality of first fixing apertures therein;
 a fan attached to the fan holder, the fan defining a plurality of second fixing apertures therein;
 an elastic gasket sandwiched between the fan holder and the fan, the elastic gasket defining a plurality of third fixing apertures therein;
 a plurality of fasteners made of plastic material, each of the fasteners comprising a shaft, a handle, a head and a bulge, the handle extending from a first end of the shaft and having a diameter smaller than that of the shaft, the head being located at a second end of the shaft opposite to the first end of the shaft and having a diameter larger than that of the shaft, the bulge being formed on the shaft, tapered along a direction from the head to the handle and adjacent to the first end of the shaft, the head abutting against the fan, the shaft extending through the second fixing apertures of the fan, the third fixing apertures of the elastic gasket and the first fixing apertures of the fan holder, the bulge abutting against the fan holder, thereby tightly sandwiching the fan, the elastic gasket and the fan holder between the head and the bulge.

6. The heat sink assembly as claimed in claim 5 wherein each of the fasteners has a slot defined in a circumference thereof and located adjacent to the bulge, and wherein the slot receives the fan holder therein.

7. The heat sink assembly as claimed in claim 5, wherein the fan holder comprises a faceplate and the first fixing apertures of the fan holder are defined in four corners of the faceplate, respectively.

8. The heat sink assembly as claimed in claim 7, wherein the fan comprises a frame and the second fixing apertures of the fan are defined in four corners of the frame, respectively.

9. The heat sink assembly as claimed in claim 8, wherein the elastic gasket comprises three interconnecting beams, the third fixing apertures of the elastic gasket are defined in four corners of the elastic gasket.

10. The heat sink assembly as claimed in claim 9, wherein a diameter of each of the first fixing apertures of the fan holder is smaller than that of the bulge of each of the fasteners.

11. The heat sink assembly as claimed in claim 10, wherein a length between the head and the bulge of each of the fasteners is slightly smaller than a combined length of thicknesses of the fan, the elastic gasket and the faceplate of the fan holder.

12. The heat sink assembly as claimed in claim 11, wherein the heat sink comprises a base and a plurality of fins arranged on the base, and wherein the base extends two steps from two opposite lateral sides thereof, respectively, and two first through holes are defined in the two steps respectively.

13. The heat sink assembly as claimed in claim 12, wherein the fan holder further comprises two fastening ears corresponding to the two steps, and two second through holes corresponding to the two first through holes of the two steps are defined in the two fastening ears, respectively.

* * * * *